United States Patent
Sato et al.

(10) Patent No.: US 6,354,794 B2
(45) Date of Patent: Mar. 12, 2002

(54) METHOD FOR AUTOMATICALLY TRANSFERRING WAFERS BETWEEN WAFER HOLDERS IN A LIQUID ENVIRONMENT

(75) Inventors: Michito Sato, Vancouver, WA (US); Hiroaki Fukabori, Takasaki; Yukio Mukaino, Nishishirakawa-gun, both of (JP)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/681,566

(22) Filed: Apr. 30, 2001

Related U.S. Application Data

(62) Division of application No. 09/184,652, filed on Nov. 3, 1998.

(51) Int. Cl.[7] .............................................. B65G 65/30
(52) U.S. Cl. ....................... 414/811; 414/404; 414/938; 414/940; 414/222.04; 414/416.02; 134/902; 118/423; 118/428; 294/67.33; 294/81.54
(58) Field of Search ........................... 414/226.01, 800, 414/810, 811, 935, 937, 938, 939, 940, 416.01, 416.03, 416.04, 416.09, 416.12; 118/719, 423, 428; 134/76, 902, 201, 66; 294/81.54, 81.5, 67.33, 67.3

(56) References Cited

U.S. PATENT DOCUMENTS

| | | | |
|---|---|---|---|
| 4,388,140 A | 6/1983 | Nakazato et al. | |
| 4,806,057 A | * 2/1989 | Cayetal | 414/226.01 |
| 5,089,084 A | 2/1992 | Chhabra et al. | |
| 5,169,408 A | 12/1992 | Biggerstaff et al. | |
| 5,211,794 A | 5/1993 | Enomoto et al. | |
| 5,246,528 A | 9/1993 | Hasegawa et al. | |
| 5,256,204 A | 10/1993 | Wu | |
| 5,269,643 A | * 12/1993 | Kodama et al. | 414/938 XV |
| 5,298,111 A | 3/1994 | Hasegawa et al. | |
| 5,301,700 A | * 4/1994 | Kamikawa et al. | 414/938 XV |
| 5,620,295 A | * 4/1997 | Nishi | 414/404 XV |
| 5,664,337 A | * 9/1997 | Davis | 414/938 XV |
| 5,697,751 A | 12/1997 | Takahashi | |

FOREIGN PATENT DOCUMENTS

| | | | |
|---|---|---|---|
| EP | A-0 798 763 | 10/1997 | |
| JP | 403030425 A | * 2/1991 | 414/940 |
| WO | WO 96/12294 | 4/1996 | |

* cited by examiner

*Primary Examiner*—Frank E. Werner
(74) *Attorney, Agent, or Firm*—Oliff & Berridge, PLC

(57) ABSTRACT

An apparatus for transferring wafers between wafer holders such as wafer cassettes, etching drums and the like includes a tank for containing a liquid transfer medium in which the wafers can be transferred. The apparatus includes a wafer transfer unit that can transfer a plurality of wafers such as semiconductor wafers between wafer holders, and maintain the wafers in a desired relative orientation during transfer. For example, the wafers can be maintained in a parallel relationship. The apparatus can be used to automatically transfer wafers to etching drums without cross-indexing of the wafers and without manual handling of the wafers.

19 Claims, 16 Drawing Sheets

METHOD FOR AUTOMATICALLY TRANSFERRING WAFERS BETWEEN WAFER HOLDERS IN A LIQUID ENVIRONMENT

CROSS REFERENCE TO RELATED APPLICATIONS

This application is a division of pending U.S. patent application Ser. No. 09/184,652, filed Nov. 3, 1998.

BACKGROUND OF INVENTION

1. Field of Invention

This invention is directed to the field of semiconductor wafer preparation and, more particularly, to an apparatus and method for transferring wafers between wafer holders.

2. Description of Related Art

During semiconductor wafer preparation, wafers are subjected to mechanical processes including slicing, grinding and lapping, which produce lattice damage in the surface regions of the wafers. This lattice damage is generally removed by chemically etching the wafers to remove the damaged surface regions of the wafers. Etching is typically conducted in an etching machine, which includes an etching drum to movably support the wafers within an acid etch solution during the etching process.

During the etching process, it is important that the wafers are positioned on the etching drum so that the wafers are parallel to, and uniformly spaced from, each other. Such positioning of the wafers is desirable so that the wafers do not contact and possibly chip or scratch each other. The wafer surfaces are very sensitive to such contact before etching (after cleaning). In addition, uniform spacing of the wafers promotes uniform etching of the wafers, so that etched wafers are uniformly sized and do not include stained regions. Non-uniform etching can produce defective wafers that are unsuitable for subsequent fabrication and must be scrapped at substantial financial cost.

It is known to manually position wafers on etching drums. The structure of etching drums makes it difficult, however, for operators to manually position the wafers on the etching drums so that the wafers are properly positioned in an efficient manner. Particularly, etching drums typically have multiple sets of grooves, with each set of grooves being designed to receive and support a single wafer. Each set of grooves typically includes several grooves that are aligned with each other. During manual positioning of the wafers, operators must position the wafers so that each of the wafers is properly received within each of the grooves of one set of grooves only. If the wafers are not properly positioned in this manner, they will be "cross-indexed" in the grooves, meaning that individual wafers are received in the grooves of more than one set of grooves. Consequently, more than one wafer can be received in individual grooves, causing the wafers to not all be parallel to, and equally spaced from, each other. As a result, the wafers can physically contact each other. Such contact can scratch the wafers and also prevent uniform etching of each wafer, as described above.

In order to correct cross-indexing, operators must manually re-position the wafers on the etching drum before etching. This approach is not satisfactory, however, for several reasons. First, the wafers are susceptible to scratching and, accordingly, it is desirable to minimize such handling of the wafers. Second, it is time-consuming for the operators to re-position the wafers and this additional step can significantly delay the performance of the etching step.

Third, the environment of the etching machine can be hazardous to operators due to the presence of the acid etch solution and associated fumes. Correcting cross-indexing problems can force the operators to be exposed to this environment for extended periods of time.

Another concern during wafer preparation is to maintain the wafers in a clean condition. For example, wafers are very sensitive to contamination after being cleaned. Accordingly, it is important to reduce exposure of the wafers to potential contamination during transfer operations, such as by reducing exposure of cleaned wafers to the ambient atmosphere prior to etching, so as to reduce oxidation and contamination of the wafers.

Thus, there is a need for an apparatus and method for transferring wafers from wafer carriers to etching drums that can reduce or even eliminate cross-indexing, reduce exposure of operators to hazardous wafer etching environments, and reduce wafer contamination during processing and transfer operations.

SUMMARY OF INVENTION

This invention provides an apparatus for transferring wafers between various types of wafer holders that can satisfy the above needs.

The wafers can be semiconductor wafers as well as other types of wafers and similar shaped objects.

The apparatus can be used to transfer wafers between various types of wafer holders. For example, in some embodiments, the apparatus can transfer wafers from wafer holders that hold wafers in set relationships, such as parallel relationships, relative to each other. The apparatus can automatically transfer wafers between such wafer holders and retain the wafers in their desired relationships during transfer. The apparatus can eliminate the need for operators to manually transfer wafers between holders. In addition, the apparatus can transfer wafers without cross-indexing the wafers. Thus, the apparatus can eliminate the need for operators to manually correct cross-indexing problems in transferred wafers. Accordingly, the wafers can be prevented from contacting and damaging each other during transfer.

The apparatus can be used to transfer wafers from wafer cassettes, which are typically used to carry semiconductor wafers during wafer preparation. The apparatus can be used to automatically transfer wafers from wafer cassettes to etching drums that are utilized in etching machines. In addition, the apparatus can automatically transfer etching drums between the apparatus and etching machines, so that manual transfer is not required.

According to an embodiment of this invention, the apparatus comprises a transfer chamber for containing a liquid, and a transfer unit for transferring at least one wafer in the liquid from a first wafer holder to a second wafer holder. For example, the first and second wafer holders can be a wafer cassette and an etching drum, respectively. In some embodiments, the liquid is preferably a high-purity liquid. By transferring wafers in the liquid, the wafers can be protected against exposure to contamination during transfer.

Although not limited to these specifics, in a particular embodiment of this invention, the apparatus can comprise one or more stands disposed in the liquid in the transfer chamber. During transfer operations, the stands can support one or more of the wafers in the liquid. The apparatus can further comprise a first lift for supporting the first wafer holder and a second lift for supporting the second wafer holder. The first lift can be moved by the transfer unit to transfer one or more wafers from the first wafer holder to the first stand in the liquid. The second lift can be moved by the transfer unit to transfer one or more wafers from the second stand to the second wafer holder in the liquid.

The transfer unit can also transfer wafers in the reverse direction in the liquid, i.e., from the second wafer holder to the second stand, from the second stand to the first stand, and from the first stand to the first wafer holder. In addition, the apparatus can transfer wafers to and from other machines used for wafer fabrication, such as etching machines, that are utilized in wafer preparation. Accordingly, wafers can be transferred back to a wafer holder after the wafers are subjected to other wafer fabrication steps.

The transfer unit is preferably automated so that it can automatically transfer the wafers in the liquid between the various wafer supports. Accordingly, the apparatus can eliminate the need for operators to manually transfer wafers between wafer holders.

This invention also provides a method for transferring wafers between wafer holders in a liquid medium that utilizes the apparatus.

BRIEF DESCRIPTION OF THE DRAWINGS

Certain preferred embodiments of this invention will be described in detail, with reference to the accompanying figures, in which.

DETAILED DESCRIPTION OF PREFERRED EMBODIMENTS

This invention provides an apparatus and method for transferring wafers between various types of wafer holders. This invention can be used to transfer wafers between wafer holders that are conventionally used to contain wafers during wafer preparation. For example, the wafer holders can be wafer cassettes, wafer boats, etching drums and the like. The wafers can be semiconductor wafers such as silicon wafers, gallium arsenide wafers and other semiconductor materials. The wafers can be composed of non-semiconductor materials as well, such as quartz wafers.

The apparatus of this invention can transfer wafers between wafer holders such that the wafers are retained in a desired orientation relative to each other during and after transfer. For example, wafers are typically supported by wafer holders in a parallel relationship, such as in individual grooves, to prevent contact between individual wafers. The apparatus can transfer wafers between various types of wafer holders and retain such parallel relationship of the wafers.

The apparatus can transfer wafers automatically, thus eliminating the need for operators to manually handle the wafer holders or wafers during transfer operations. In addition, this invention can reduce exposure of wafers to contamination during transfer, and can eliminate physical damage to wafers that can occur during manual handling operations.

The above and other advantages of this invention will be described below with reference to the drawings. The figures illustrate the transfer of wafers between wafer cassettes and an etching drum. The etching drum is utilized in an etching machine to etch the wafers. The etching machine does not form a part of this invention and, accordingly, is not illustrated or described in detail herein. It will be understood by those skilled in the art that the apparatus of this invention can be used to transfer wafers between different types of wafer holders as well such as, for example, between different wafer cassettes or different etching drums. In addition, it will be understood that the wafers can be transferred between more than two different wafer holders.

Figure 1:
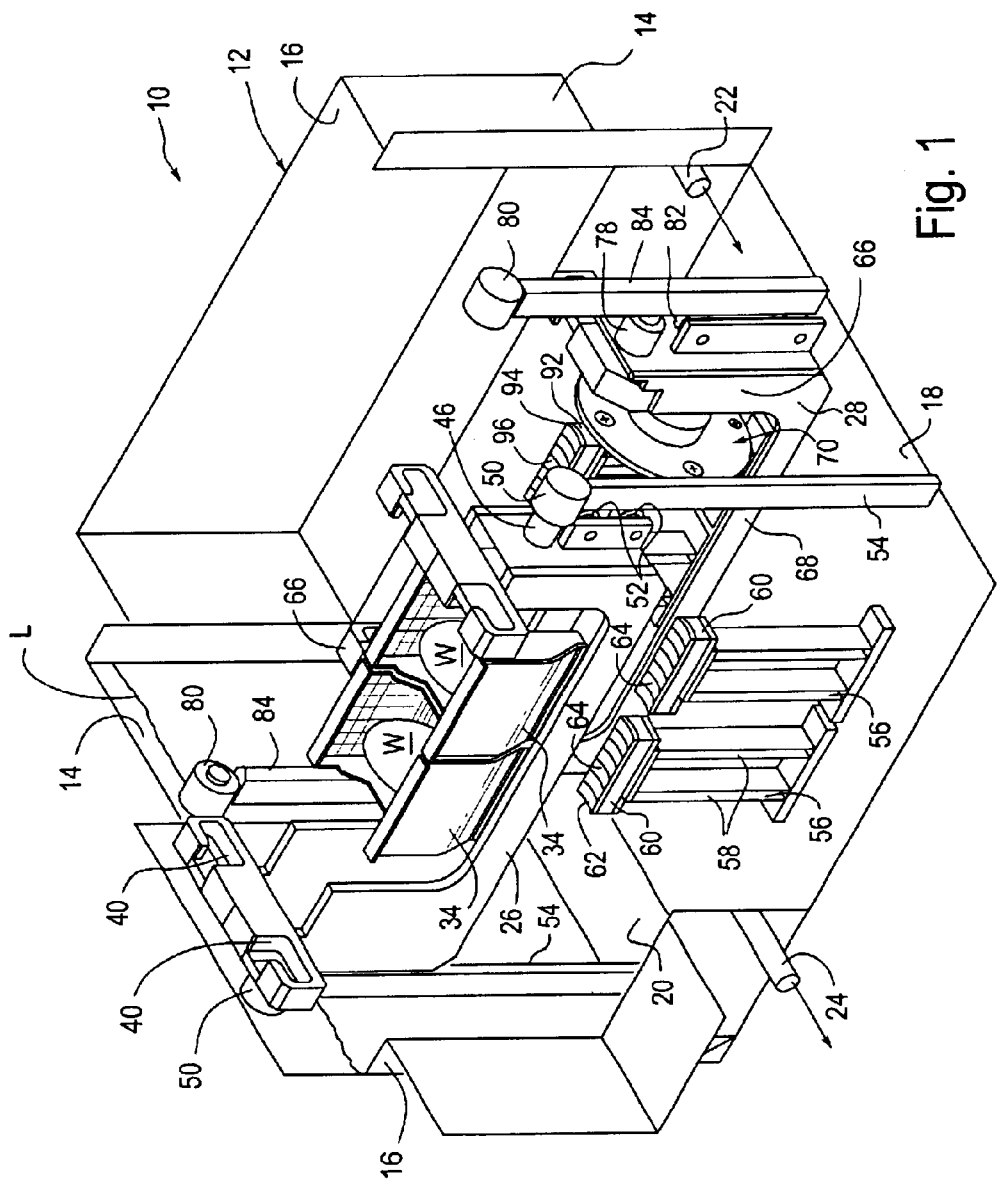
FIG. 1 is a partial perspective view of an apparatus for transferring wafers between wafer holders in a liquid in accordance with an embodiment of this invention, showing a cassette lift supporting a pair of wafer cassettes in a raised position in a transfer chamber.

FIG. 1 illustrates a portion of an apparatus 10 according to an embodiment of this invention that can be used to transfer wafers between wafer holders in a liquid environment. The illustrated apparatus includes a tank 12 shown partially broken away. The tank is typically open at the upper end as shown. The tank includes upstanding side walls 14, 16 and a bottom wall 18 forming a housing. Various tank configurations can be used. The housing defines a transfer chamber 20 for containing a liquid that functions as the wafer transfer medium. The liquid can be any suitable high-purity liquid that is non-contaminating to the apparatus and to the wafers. Typically, the liquid is high-purity deionized water. The liquid level L in the transfer chamber is typically approximately as shown in FIG. 1.

According to an aspect of this invention, the liquid in the tank 12 can comprise a chemical that forms an oxide layer on the wafers, to protect the wafers from scratching due to contact between each other. For example, the liquid can comprise high-purity water and up to about 5% of hydrogen peroxide. Other suitable chemicals that promote oxide layer formation can be used as well.

The apparatus 10 can also include a liquid supply system that circulates the liquid into and out of the tank. The liquid supply system can include a liquid inlet 22 and a liquid outlet 24 or an alternative overflow system to enable the liquid to be filled into the tank 12 to maintain the liquid in the tank in a clean condition. In addition, the liquid supply system can maintain a desired liquid level in the tank 12. However, it will be readily apparent that such a liquid supply system is not necessary in all embodiments of this invention, and that wafer contamination by the liquid can be prevented in other manners.

It will be understood by those skilled in the art that the apparatus 10 of this invention can be used to transfer wafers between wafer holders when no liquid is contained in the tank 12. In such embodiments, the wafers can also be transferred without requiring operators to handle the wafers. It is preferable, however, to transfer wafers in a liquid for at least the following reasons. First, the high-purity liquid prevents the wafers from being exposed to the atmosphere during the transfer operation, thereby eliminating contamination of the wafers by the air during transfer. Second, the increased viscosity of the liquid as compared to the air can assist in maintaining the wafers in the desired relative orientation with respect to each other during transfer.

Figure 2:
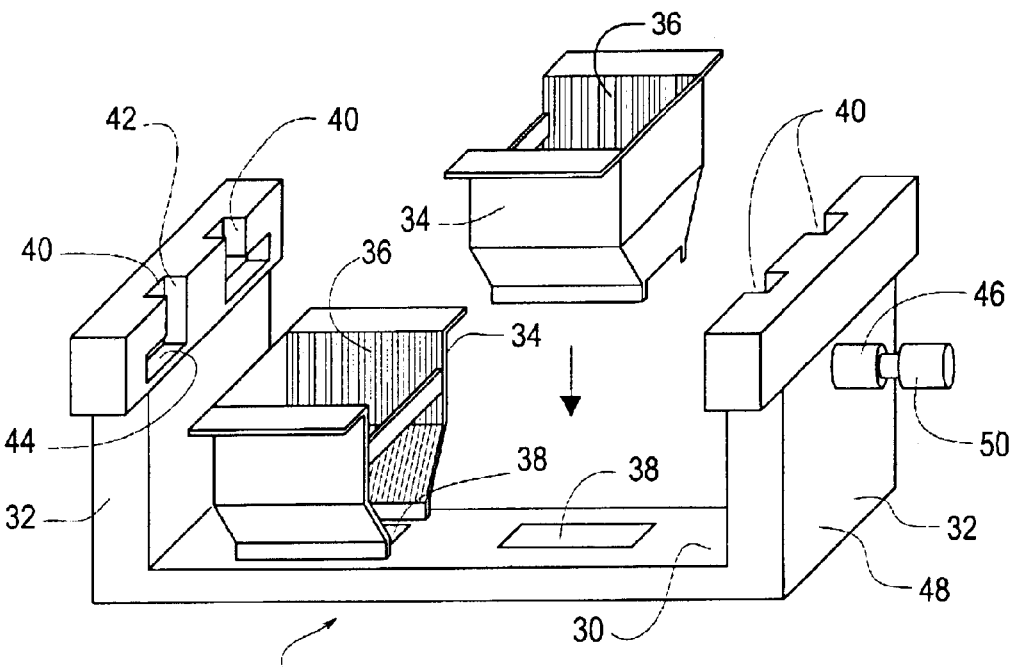
FIG. 2 illustrates the manner of placing the wafer cassettes onto the cassette lift.

The apparatus 10 further comprises a cassette lift 26 and a drum lift 28 laterally spaced from the cassette lift 26. The cassette lift 26 is shown in a fixed, raised position in FIG. 1. Referring also to FIG. 2, the cassette lift 26 includes a bottom wall 30 and opposed upstanding side walls 32. The bottom wall 30 is sized to support at least one wafer cassette 34 (two wafer cassettes 34 are shown). More or less wafer cassettes 34 can be used in other embodiments of this invention. Each wafer cassette 34 typically includes a plurality of parallel grooves 36, which are each sized to support one wafer, such that the wafer cassettes can support a plurality of wafers in a parallel relationship. For simplification, only one wafer W is shown in each wafer cassette 34 in FIG. 1. Each wafer cassette 34 is typically sized to support about 25 or less wafers. One or more holes 38 extend through the bottom wall 30 of the cassette lift 26. The number of holes 38 can be varied depending on the number of wafer cassettes 34 supported on the cassette lift 26. The side walls 32 each include two slots 40 that are typically generally L-shaped. The slots 40 each typically include a vertical portion 42 and a horizontal portion 44. The horizontal portions 44 extend outwardly in opposite directions to each other.

A first cassette lift stop element 46 is provided on the outer surface 48 of each of the side walls 32 of the cassette lift 26. The first cassette lift stop elements 46 each releasingly engage a second cassette lift stop element 50 provided on the side walls 14 of the tank 12 as shown in FIG. 1, to hold the cassette lift 26 in the vertically fixed, raised position. The first and second cassette lift stop elements 46, 50 can be selectively disengaged from each other by moving the second cassette lift stop elements 50 away from the first cassette lift stop elements 46 to enable the cassette lift 26 to be moved vertically downward in the tank 12 as described in greater detail below. One or more rollers 52 are provided on each side wall 32 of the cassette lift 26. The rollers 52 mate with vertically extending rails 54 which are mounted to each of the opposed side walls 14 of the tank 12, to enable the cassette lift 26 to be moved vertically in the tank 12 in the direction of the rails 54.

Figure 9:
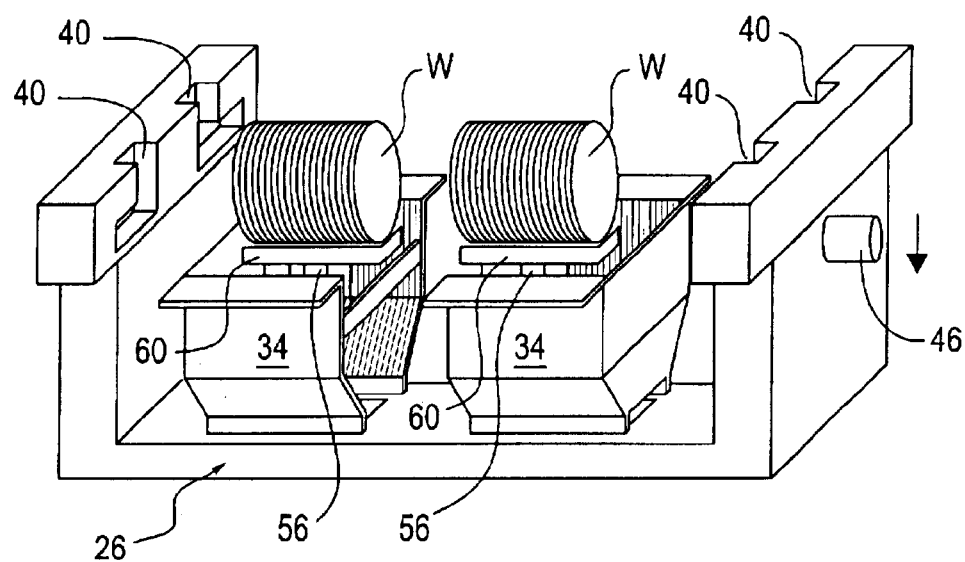
FIG. 9 shows the cassette lift of FIG. 2 in the lowered position of FIG. 8, with a plurality of wafers positioned in a parallel relationship on the first wafer stands.

The cassette lift 26 supports the wafer cassettes 34 prior to transferring wafers from the cassette lift 26 to one or more first wafer stands 56 of the apparatus 10. As shown, a pair of laterally spaced first wafer stands 56 are mounted to, and extend upwardly from, the bottom wall 18 of the tank 12. In embodiments in which more or less than two wafer cassettes 34 are utilized, the apparatus 10 can include a number of first stands 56 corresponding to the number of wafer cassettes 34. The first wafer stands 56 can each include a pair of upstanding legs 58 and a wafer basket 60 attached to the upper ends of the legs 58. The wafer baskets 60 include a upper surface 62 in which a plurality of parallel grooves 64 are formed. The upper surface 62 is typically concave to match the configuration of the wafers. The grooves 64 are each sized to receive and support one wafer in a vertical orientation, such that the first wafer stands 56 can each support a plurality of wafers in a parallel relationship, as depicted in FIG. 9. In the illustrated relationship, the wafers are spaced from each so that no contact occurs between the wafers.

Figure 8:
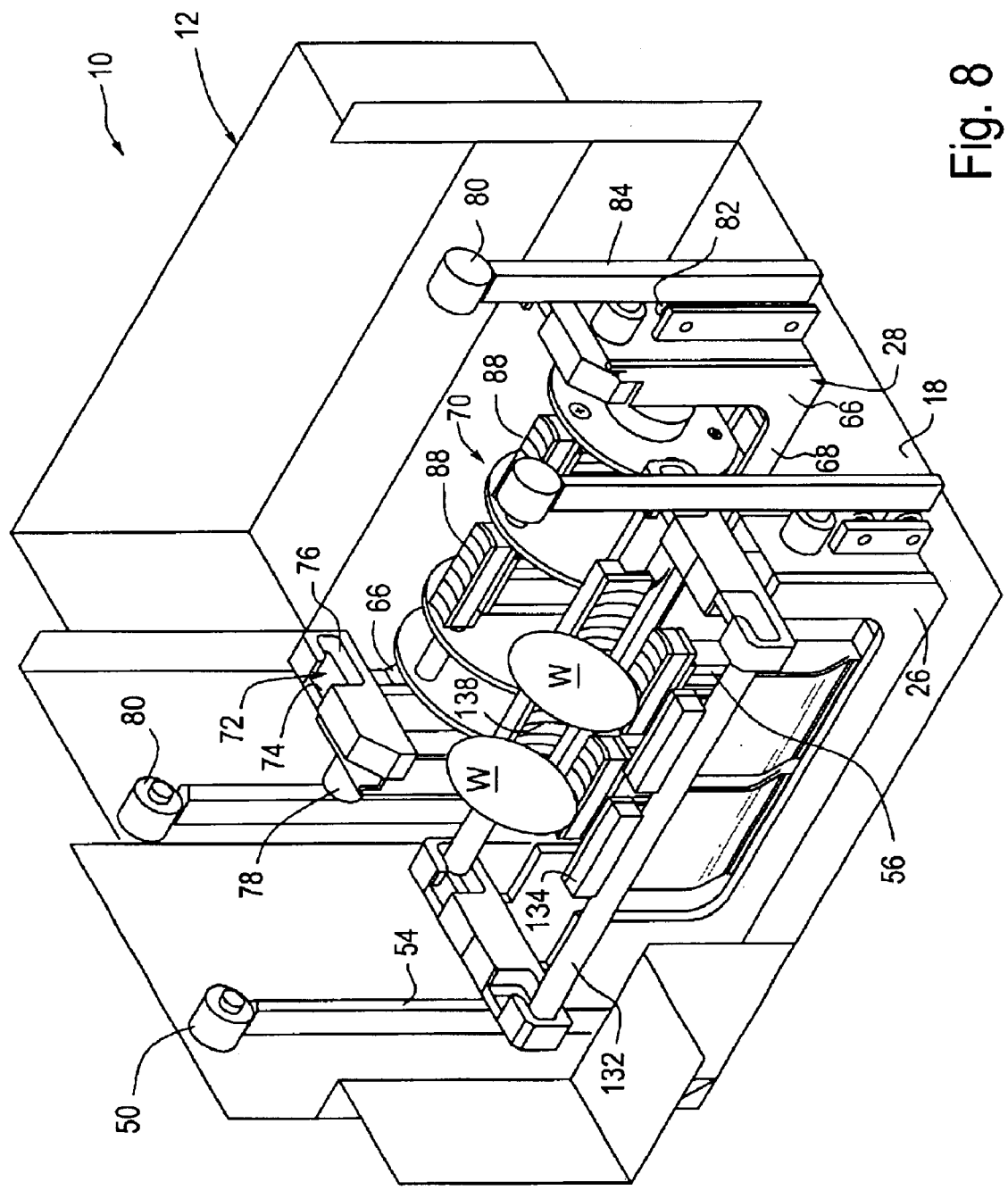
FIG. 8 illustrates the apparatus of FIG. 1 with the cassette lift in a lowered position after the wafers contained in the wafer cassettes are transferred to first wafer stands.

The drum lift 28 typically can have a construction similar to that of the cassette lift 26. As shown, the drum lift 28 can comprise opposed upstanding side walls 66 and a bottom wall 68. The side walls 66 are spaced from each other by a distance greater than the length of an etching drum 70 that is supported on the drum lift 28. The side walls 66 each include a slot 72 that is typically generally L-shaped slot 72 (FIG. 8). The slots 72 can include a vertical portion 74 and a horizontal portion 76. A first drum lift stop element 78 is provided on the outer surface of each side wall 66 of the drum lift 28. The first drum lift stop elements 78 each engage a second drum lift stop element 80 provided on the side walls 14 of the tank 12, to maintain the drum lift 28 in a vertically fixed position. One or more rollers 82 are provided on each side wall. The rollers 82 mate with vertically extending rails 84 mounted to each of the opposed side walls 14 of the tank 12, such that the drum lift 28 is vertically movable in the tank 12 along the direction of the rails 84.

Figure 17:
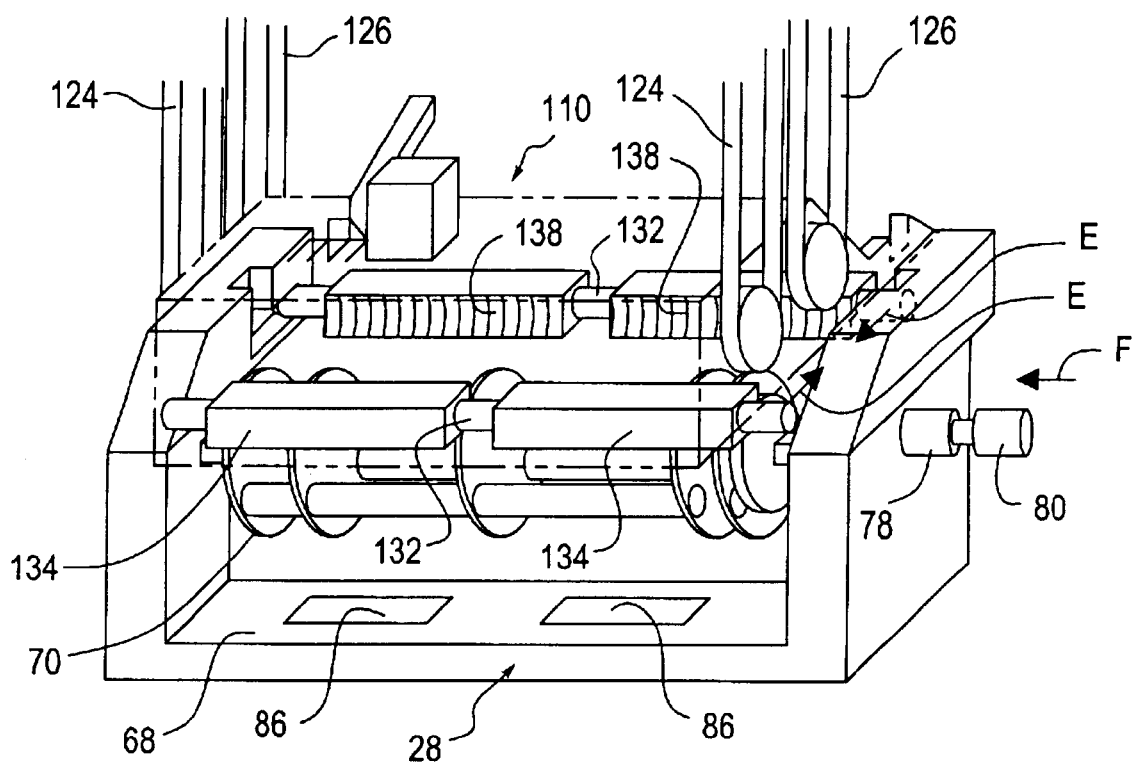
FIG. 17 illustrates the manner of closing the wafer chucks and engaging the drum lift stop elements to hold the drum lift in the raised position.

The bottom wall 68 of the drum lift includes one or more holes 86 which extend through the bottom wall 68 (FIG. 17). The number of holes 86 typically equals the number of holes 38 in the cassette lift 26. One or more second wafer stands 88 (two are shown) are mounted to the bottom wall 18 of the tank 12 (see FIG. 8). The second wafer stands 88 each include each include a pair of upstanding legs 90 and a wafer basket 92 attached to the upper ends of the legs 90. The wafer baskets 92 include a concave upper surface 94 defining a plurality of parallel grooves 96. The grooves 96 are each sized to receive and support a wafer in a vertical orientation, such that the second wafer stands 88 can each support a plurality of wafers in a parallel relationship. As described below, the holes 86 in the bottom wall 68 of the drum lift 28 are each configured to receive the wafer basket 92 of one of the second wafer stands 88 during wafer transfer.

It will be understood by those skilled in the art that the number of second wafer stands 88 can vary in embodiments of this invention. In the illustrated embodiment, the apparatus 10 comprises two second wafer stands 88, which equals the number of first wafer stands 56. However, the number of first and second wafer stands can be different in some embodiments. Furthermore, the size of the wafer baskets 60, 92 of the first and second wafer stands 56, 88, respectively, can be varied to vary the wafer holding capacity. For example, a single wafer stand 88 including a wafer basket 92 having the wafer holding capacity of the two illustrated wafer baskets 92 combined can alternatively be used instead of two second wafer stands 88. Such configurations are also possible for the first wafer stand 56.

The drum lift 28 supports the etching drum 70 in the tank 12 so as to enable transfer of the wafers from the first wafer stands 56 to the second wafer stands 88, and from the second wafer stands 88 to the etching drum 70, as described in detail below.

Figure 21:
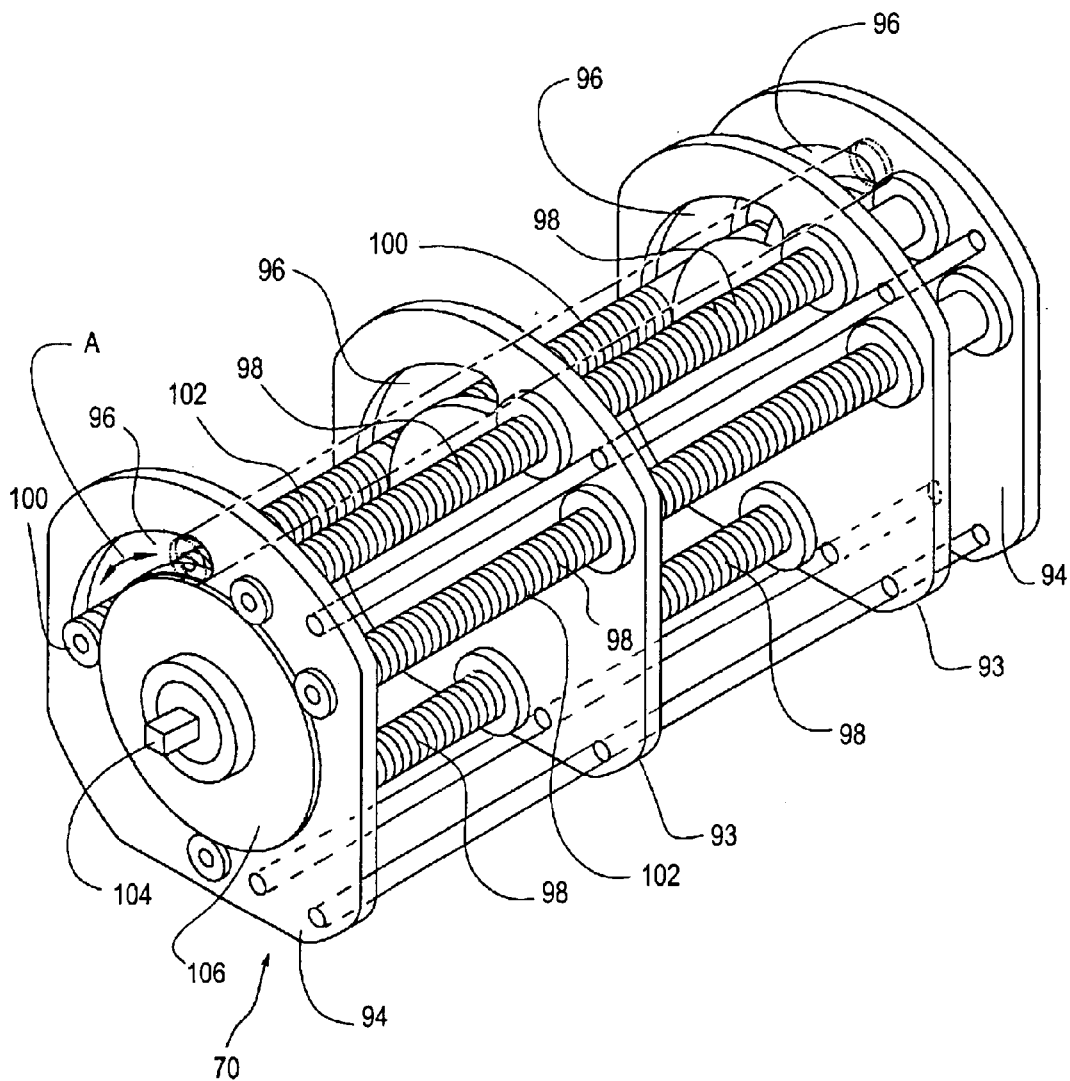
FIG. 21 illustrates an etching drum that can be used in the apparatus of this invention.

An embodiment of the etching drum 70 that can be used in the apparatus 10 is illustrated in greater detail in FIG. 21. As shown, the etching drum 70 comprises a plurality of laterally spaced plates 93, 94. The plates are typically arranged in a parallel relationship relative to each other as shown. The number of plates can be varied. For example, the etching drum 70 shown in FIG. 17 includes five plates, while the etching drum 70 shown in FIG. 21 includes four plates. The plates 93, 94 each include an arcuate shaped through hole 96. A plurality of fixed rods 98 and a movable locking rod 100 extend longitudinally along the etching drum 70. The fixed rods 98 connect the plates 93, 94 together and maintain the plates 93, 94 in a fixed relationship relative to each other. The fixed rods 98 and the locking rod 100 each include a plurality of grooves 102. The grooves 102 in each rod are each aligned with a groove in each of the other respective rods, and the aligned groups of four grooves 102 can each receive and support one of the wafers. The locking rod 100 extends through the arcuate shaped through holes 96 of each of the plates 93, 94 and is movable along the arcuate shaped through holes 96 between an upper, locking position shown in phantom line and an illustrated lower, unlocking position, as represented by the arrows A. A plurality of wafers can be supported in the grooves 102 when the movable rod 100 is in the unlocking position, such that the wafers can be selectively removed from the etching drum 70. The plurality of wafers can be supported in the grooves 102 when the movable rod 100 is in the locking position, such that the wafers cannot be accidentally or intentionally removed from the etching drum 70.

The etching drum further comprises a central shaft 104 which extends outwardly from each of the end plates 94. To support the etching drum 70, vertical slots (not shown) are formed in the inner surface of each of the side walls 66 of the drum lift 28. The shaft 104 can be inserted into the respective slots in a downward direction to support the etching drum 70 on the drum lift. As described below, the etching drum 70 can be lifted such that the shaft 104 is moved upwardly in the respective slots to remove the etching drum 70 from the drum lift 28. The etching drum 70 also includes a gear mechanism 106 that can engage mating gears in a conventional etching machine when the etching drum 70 is placed in the etching machine to etch the wafers following wafer transfer.

As shown in some of the figures, including FIGS. 3, 4, 5, 7, 11, 13, 17 and 19, the apparatus 10 comprises a transfer unit 110 that performs multiple functions during wafer transfer, enabling wafers to be automatically transferred between different wafer holders. The wafer transfer unit 110 also enables wafers to be transferred to and from machines, such as an etching machine, that are utilized in wafer fabrication.

In the illustrated embodiment, the transfer unit 110 enables a plurality of wafers to be automatically, simultaneously transferred from wafer holders such as the wafer cassettes 34 to other wafer holders such as the etching drum 70. During this transfer process, the wafers are transferred from the wafer cassettes 34 to the first wafer stands 56, from the first wafer stands 56 to the second wafer stands 88, and from the second wafer stands 88 to a second wafer holder such as the etching drum 70. These wafer transfer steps can each be performed in the liquid contained in the tank 12, such that the wafers are not exposed to the ambient environment during transfer between the wafer holders. In addition, the wafers can be transferred during each of these steps such that the wafers are retained in a desired relationship to each other, such as in a parallel relationship shown in some figures.

Figure 3:
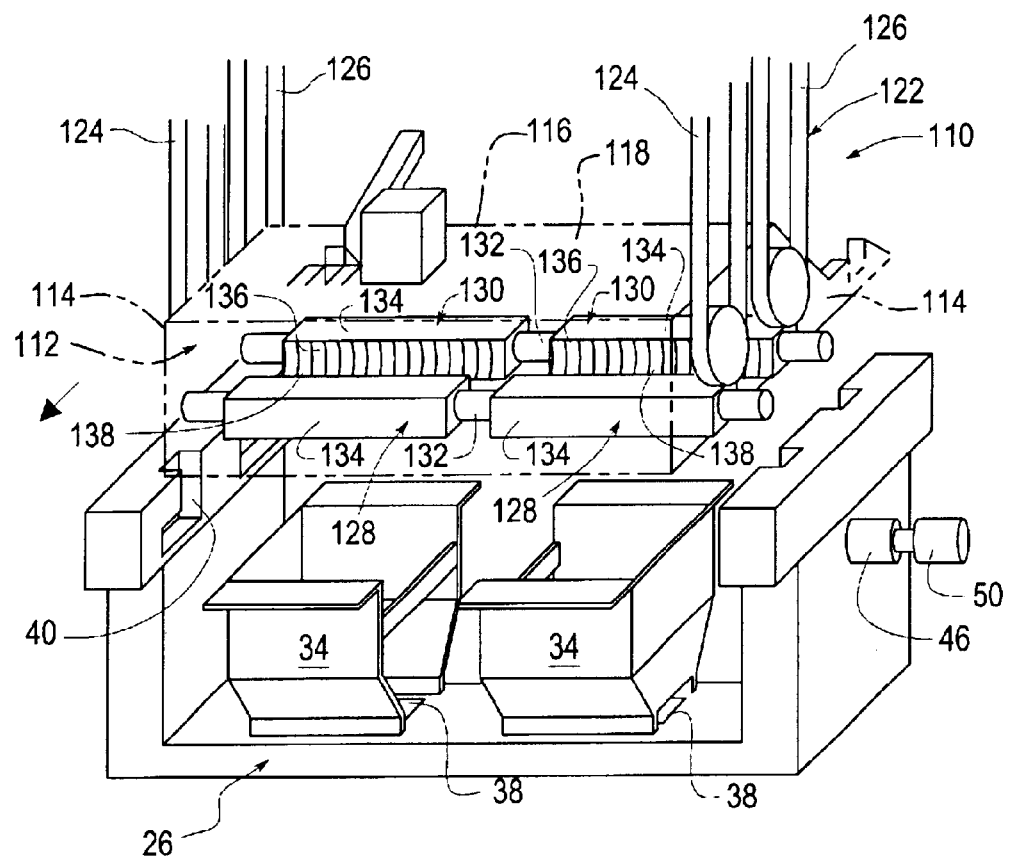
FIG. 3 illustrates a transfer unit of the apparatus according to an embodiment of this invention in a raised position prior to being engaged with the cassette lift of FIG.

Only the relevant portions of the transfer unit 110 needed for illustrative purposes are shown in detail in the figures and described below. As shown in FIG. 3, an embodiment of the transfer unit 110 comprises a body portion 112 including opposed end faces 114, opposed side faces 116 and a top face 118. The body portion 112 can have other shapes as well, including other rectangular shapes.

Figure 22:
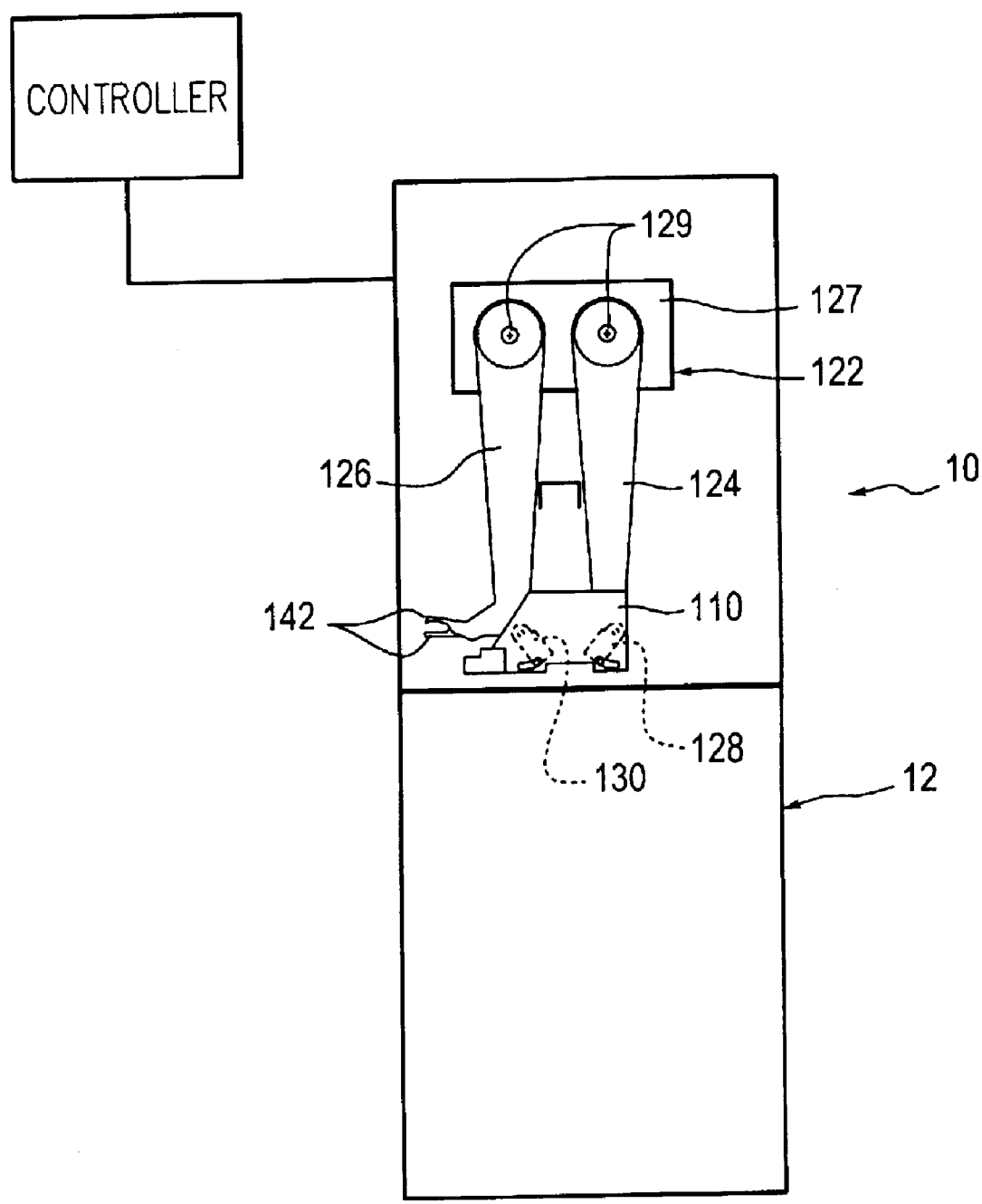
FIG. 22 illustrates the tank of the apparatus and a portion of the transfer unit disposed above the tank.

Referring to FIG. 22, the transfer unit 110 also includes a drive mechanism 122 that moves the body portion 112 relative to the tank 12. The drive mechanism 122 can include two pairs of arms 124, 126. Each pair of arms 124, 126 are pivotally connected at upper ends to a mounting surface 127 and at lower ends to one of the opposed end faces 114 of the body portion 112 of the transfer unit 110. The arms 124, 126 are vertically movable and are also pivotal about pivot axes 129 to move the transfer unit 110 vertically and laterally in the tank 12 as described below. The drive mechanism 122 can also include drive elements (not shown) for moving the arms 124, 126. The operation of the drive elements can be controlled by an operator of the apparatus 10. For example, the operation of the apparatus 10 can be controlled by a controller 150, which can be automatically programmed so that the transfer unit 110 performs the operations described below in an automated manner, so that the operator needs only to start the transfer process and to stop the operation of the apparatus after transfer is completed.

A pair of wafer chucks 128, 130 are provided on the bottom face 120 of the body portion 112. The wafer chucks 128, 130 each include a rod 132 and one or more wafer engagement portions 134 attached on the rod 132. (In FIGS.

6, 8, 10, 12, 14 and 16, only the wafer chucks 128, 130 of the transfer unit 110 are shown for simplification.) The rods 132 are typically cylindrical shaped as shown, and can optionally have other shapes such as rectangular. The wafer engagement portions 134 each include an inner surface 136 including a plurality of grooves 138 each sized to receive a wafer (only the grooves 138 of the wafer chucks 130 are shown). The inner surface 136 of each wafer engagement portion 134 is typically concave shaped to match the circumferential shape of the wafers. The grooves 138 are preferably parallel to each other. As described in greater detail below, the wafer chucks 128, 130 are moved automatically toward and away from each other during wafer transfer operations. The wafer chucks 128, 130 can be moved toward and away from each by a retractable pneumatic-operated rod or the like (not shown). The operation of the wafer transfer apparatus 10 will now be described with reference to the drawing figures which sequentially illustrate a series of steps that can be automatically performed by the wafer transfer apparatus during the transfer of wafers from the wafer cassettes 34 to the etching drum 70 disposed on the drum lift 28. In these figures, only portions of the apparatus 10 are illustrated for simplicity and clarity. As shown in FIG. 2, open H-bar sides of the wafer cassettes face toward each other to enable bar codes on the wafers to be automatically read before and after wafer cassette 34 transfer.

FIG. 2 shows the manner of placing two wafer cassettes 34 onto the cassette lift 26. This step is typically performed manually by an operator, with the wafer cassettes 34 being positioned above the liquid in the tank 12. The wafer cassettes 34 each have an open bottom. One of the wafer cassettes 34 is shown positioned over one of the holes 38 in the bottom wall 30 of the cassette lift 26. The other wafer cassette 34 is shown before being lowered onto the cassette lift 26 over the other hole 38. The cassette lift 26 is retained in a fixed upper position in which the wafer cassettes 34 are positioned above the liquid in the tank, by engagement of the first and second cassette lift stop elements 46, 50, as shown in FIG. 2.

Figure 4:
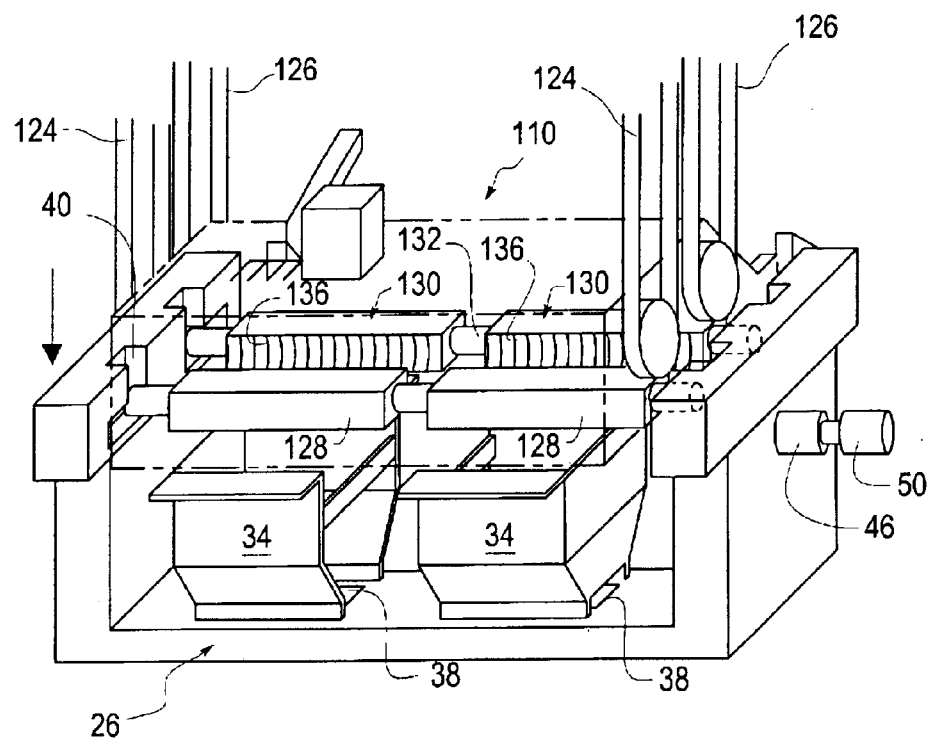
FIG. 4 illustrates the transfer unit of FIG. 3 with the wafer chucks of the transfer unit in a closed position.
Figure 5:
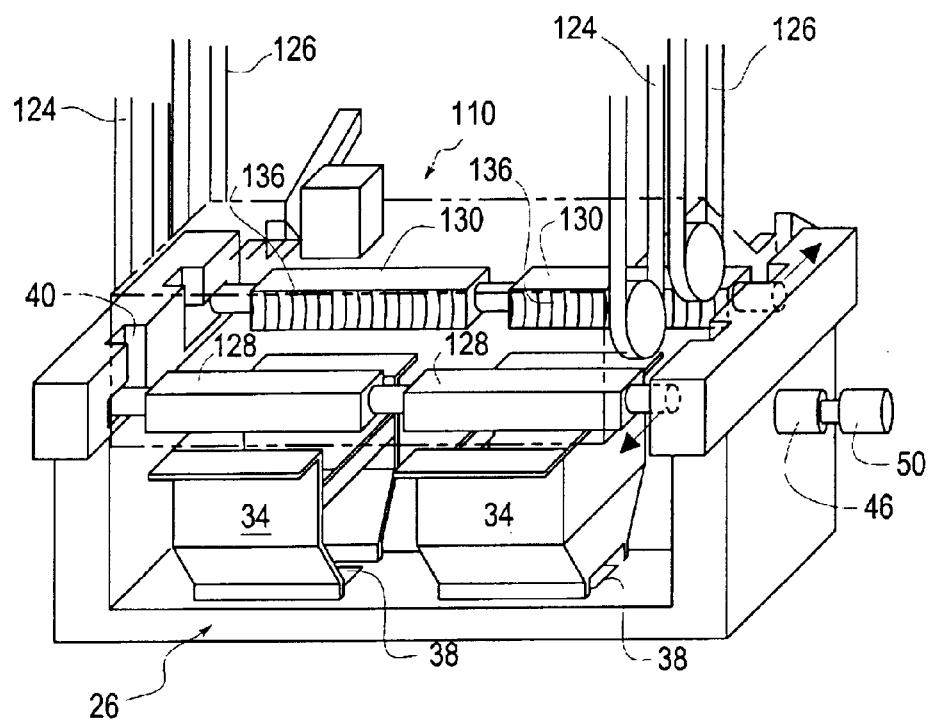
FIG. 5 illustrates the transfer unit of FIG. 4 with the wafer chucks in an open position in which the transfer unit is fully engaged with the cassette lift in the raised position.
Figure 6:
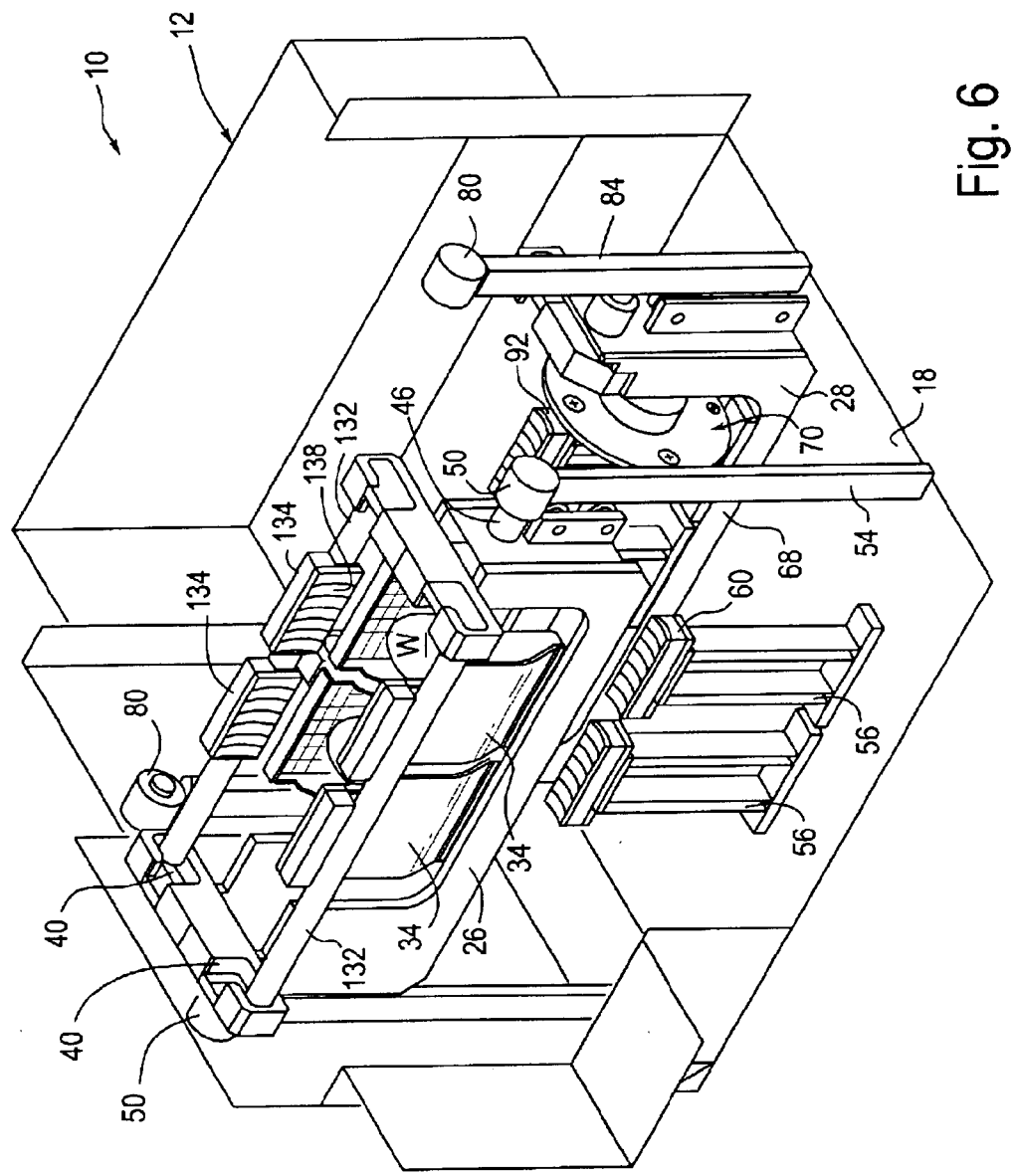
FIG. 6 illustrates the apparatus of FIG. 1 with the cassette lift in the raised position and the wafer chucks engaged with the cassette lift.

FIG. 3 shows the transfer unit 110 positioned above the cassette lift 26 before the transfer unit 110 is engaged with the cassette lift 26. The transfer unit 110 is engaged with the cassette lift 26 by lowering the transfer unit 110 such that the outer portions of the rods 132 of the wafer chucks 128, 130 are inserted into the vertical portions 42 of the slots 40 on the side walls 32 as shown in FIG. 4. Once the rods 132 reach the bottom ends of the vertical portions 42, the wafer chucks 128, 130 are moved horizontally away from each other (opened) such that the rods 132 are moved into the horizontal portions 44 of the slots 40, as shown in FIGS. 5 and 6.

Figure 7:
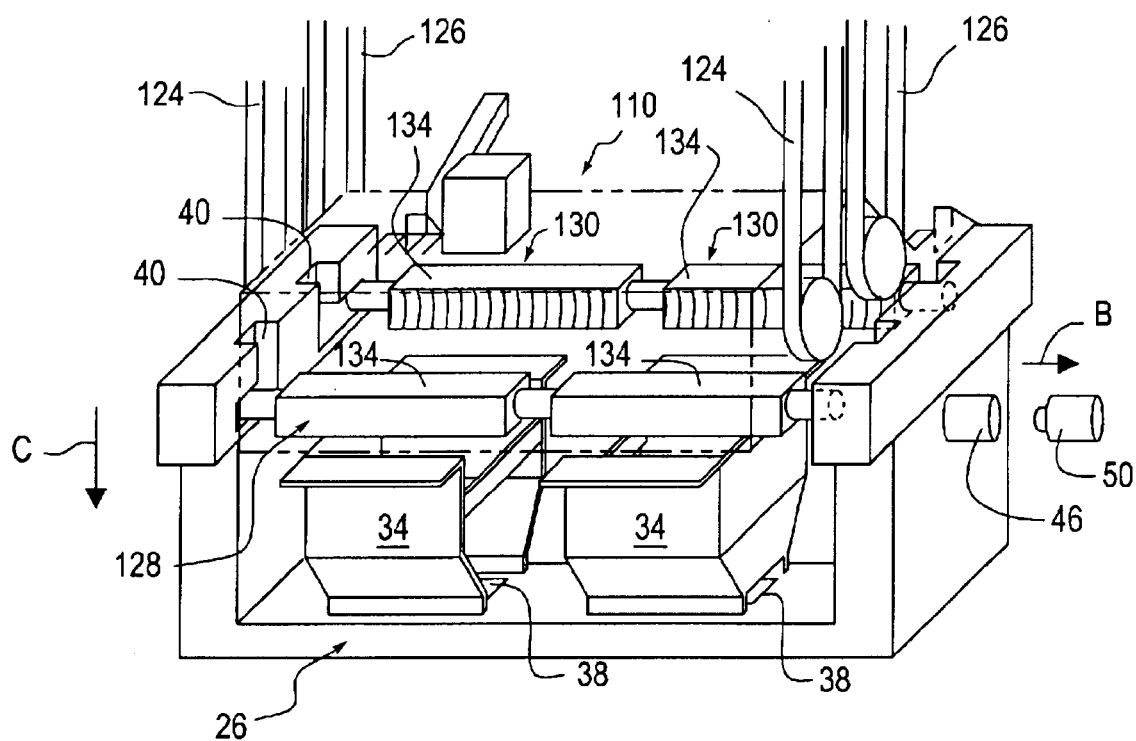
FIG. 7 illustrates the transfer unit and cassette lift of FIG. 5 and the manner of disengaging cassette lift stop elements to enable the cassette lift to be lowered into the liquid in the tank by the transfer unit.

To next lower the cassette lift 26 into the liquid in the tank 12, the second cassette lift stop element 50 is moved horizontally to disengage from the first cassette lift stop element 46 as depicted by the arrow B in FIG. 7. The transfer unit 110 can then be lowered as depicted by the arrow C to lower the cassette lift 26 into the liquid in the tank 12. The transfer unit 110 lowers the cassette lift 26 into the liquid such that the holes 38 in the bottom wall 30 of the cassette lift 26 move downwardly so as to each receive one of the first wafer stands 56. FIGS. 8 and 9 show the cassette lift 26 in a bottom position in which the first wafer stands 56 extend upwardly through the holes 38 and the wafers are transferred from the wafer cassettes 34 to the respective wafer baskets 60. The wafer baskets 60 can support the wafers in the same orientation as the wafers are supported on wafer cassettes 34. The wafer cassettes 34 are positioned substantially below the wafer baskets 60.

Figure 10:
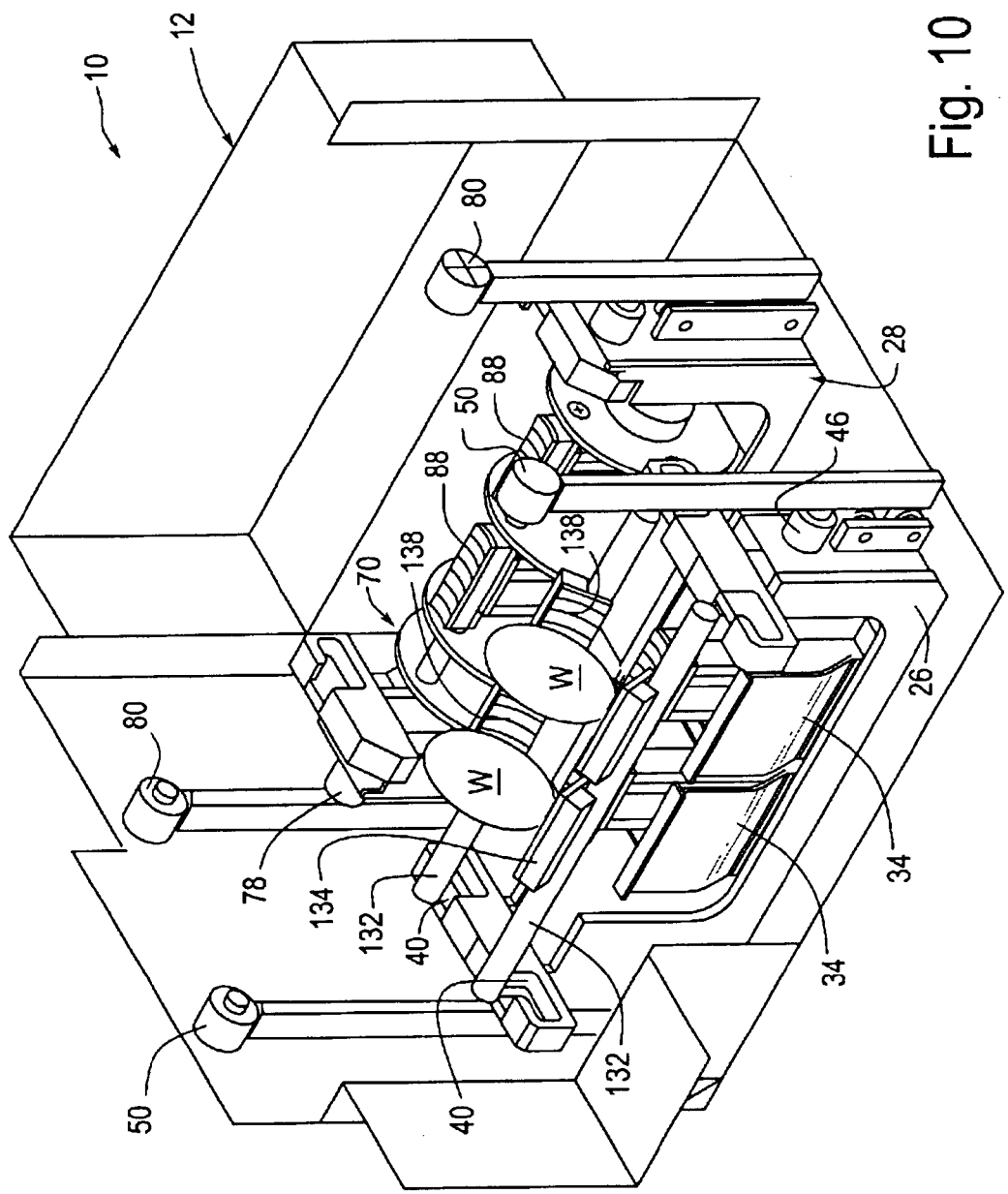
FIG. 10 illustrates the apparatus of FIG. 8 after disengaging the wafer chucks from the cassette lift and engaging wafer engagement portions of the wafer chucks with the wafers.
Figure 11:
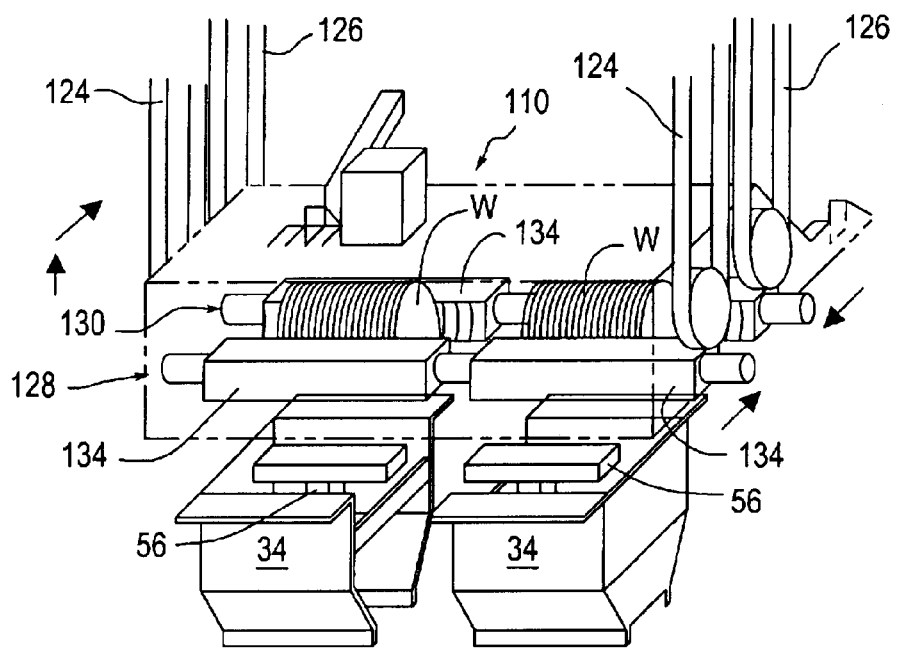
FIG. 11 shows the transfer unit in a raised position above the first wafer stands after removing the wafers from the first stands, and the wafer cassettes in the lowered position in the tank.

The wafers are next transferred from the first wafer stands 56 to the drum lift 28. Referring to FIG. 10, in order to transfer the wafers from the first wafer stands 56, the wafer chucks 128, 130 are brought toward each other (closed) so that pairs of opposed grooves 138, including a groove 138 of each opposed wafer engagement portion 134, each receive one of the wafers. The wafer engagement portions 134 support the wafers in a parallel relationship relative to each other as shown. FIG. 11 shows the wafer transfer unit 110 in a raised position above the first wafer stands 56 after the wafers have been engaged and lifted off of the first wafer stands 56 by the wafer transfer unit 110.

Figure 13:
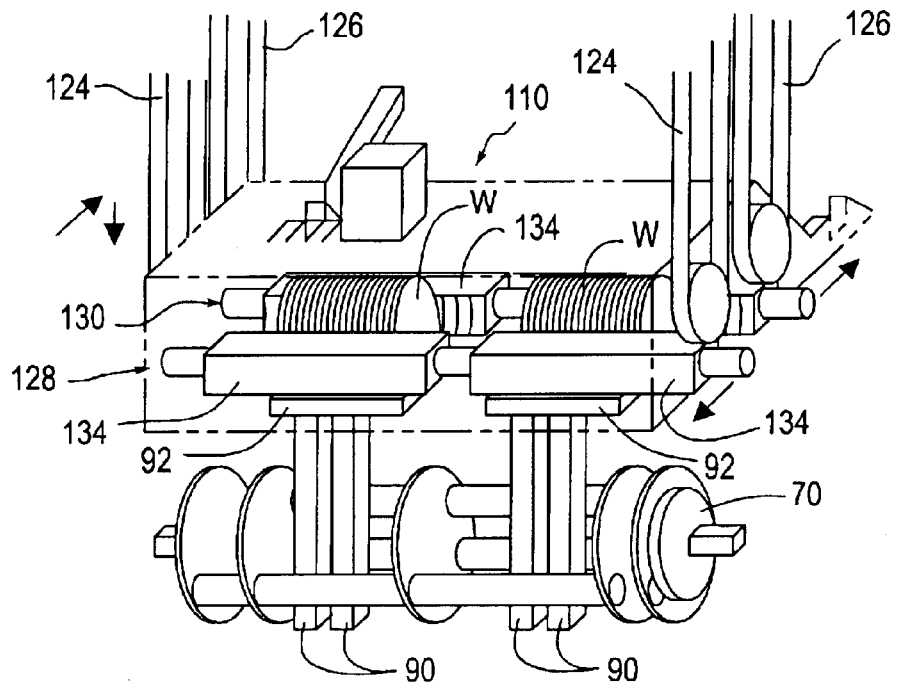
FIG. 13 shows the transfer unit in the raised position above the second wafer stands with the wafer chucks in the closed position supporting the wafers.
Figure 12:
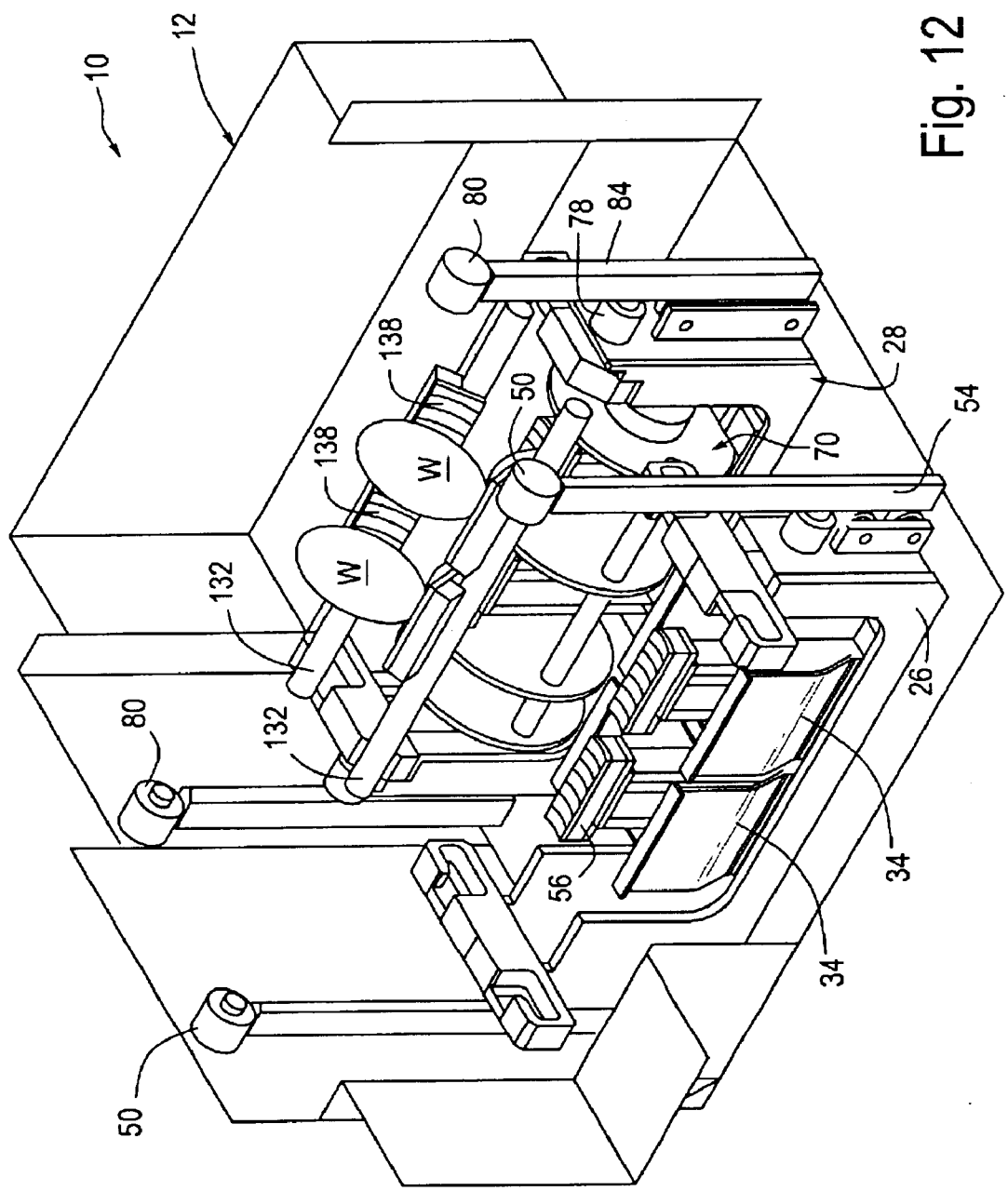
FIG. 12 illustrates the apparatus of FIG. 10 with the wafer chucks in a raised position above second wafer stands prior to the wafer chucks being engaged with the drum lift.
Figure 14:
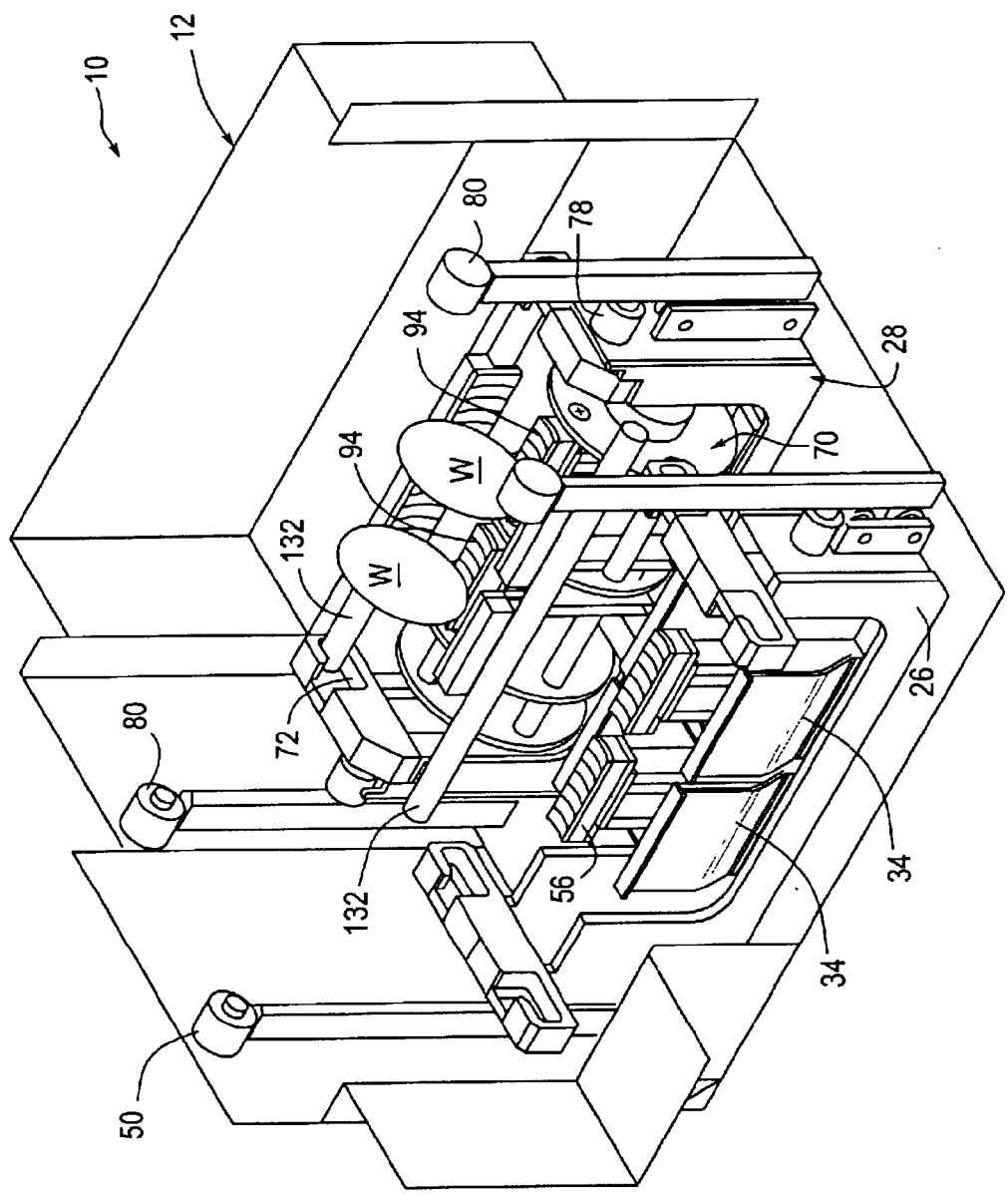
FIG. 14 shows the apparatus of FIG. 12 with the wafer chucks opened and engaged with the drum lift and the cassettes supported on the second wafer stands in the lowered position of the drum lift.

The wafers supported by the wafer chucks 128, 130 are then moved laterally in the tank 12 to the drum lift 28. The wafers are positioned above the second wafer stands 88 as shown in FIG. 12 and lowered onto the second wafer stands 88 as shown in FIG. 13. The wafers are positioned in the same parallel orientation on the second wafer stands 88 as on the first wafer stands 56. FIGS. 13 and 14 show the drum lift 28 and etching drum 70 in a lowered position at this stage of the wafer transfer operation.

Figure 15:
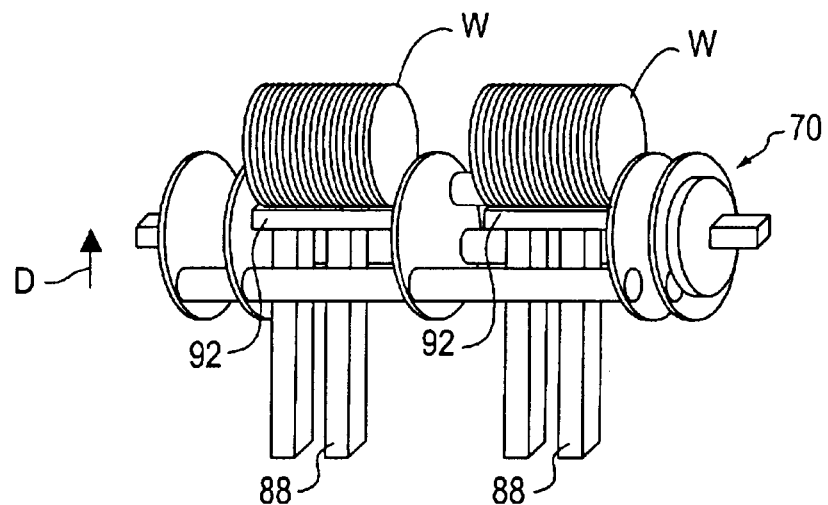
FIG. 15 illustrates the wafers positioned in a parallel relationship on the second stands and the etching drum in a lowered position, with the arrow representing the direction of movement of the etching drum to a raised position.
Figure 16:
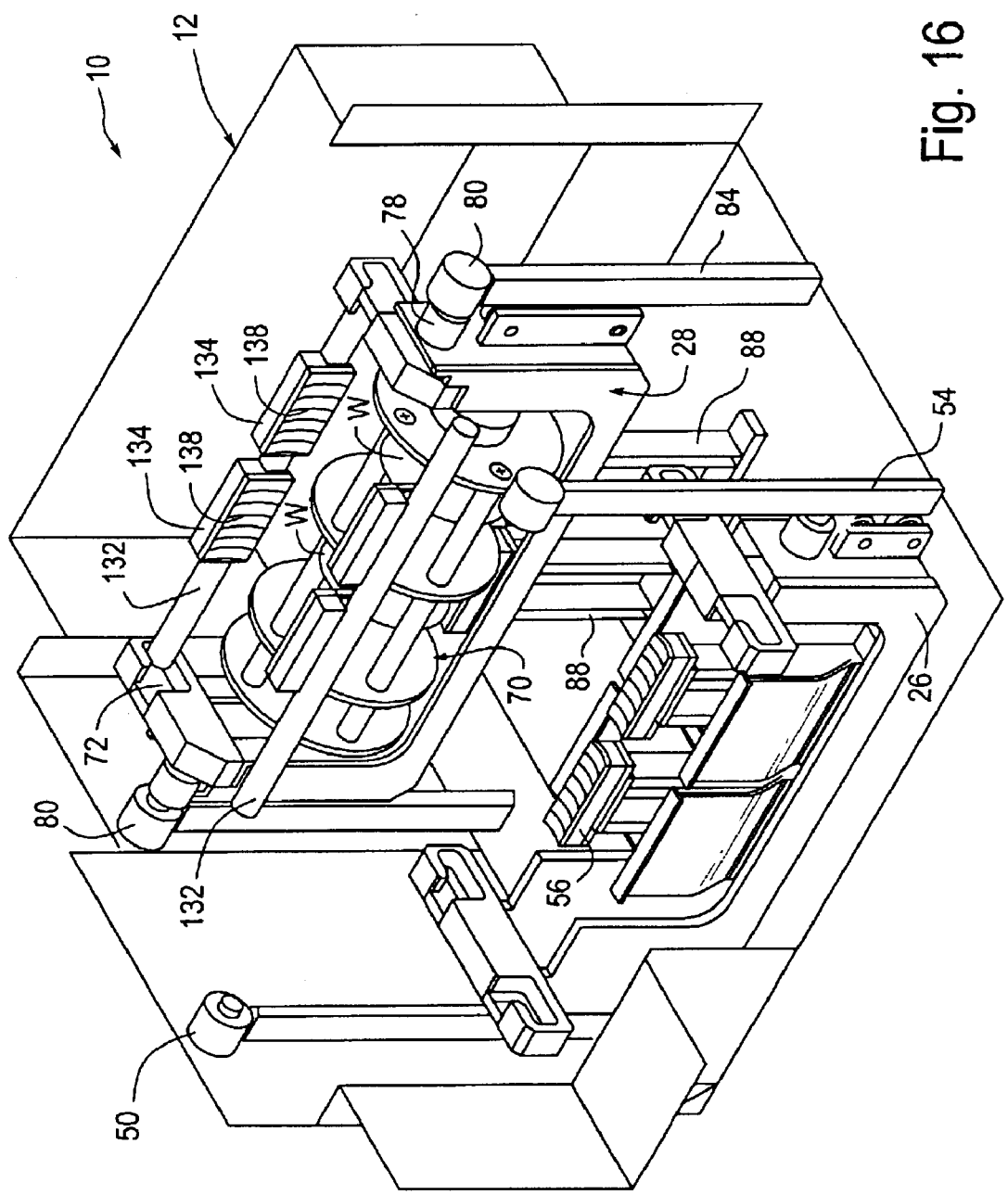
FIG. 16 illustrates the apparatus of FIG. 14 with the drum lift in a raised position in which the wafers are supported by the etching drum.

Next, the wafers are transferred from the second wafer stands 88 to the etching drum 70. This is achieved by lifting the drum lift 28 and supported etching drum 70 upwardly in the tank 12 in the direction of the arrow D shown in FIG. 15. To lift the drum lift 28 and etching drum 70, the rods 132 of the wafer chucks 128, 130 of the wafer transfer unit 110 are engaged in the horizontal portions 76 of the slots 72 formed in the drum lift 28 and the wafer transfer unit 110 is raised until the wafers supported on the second wafer stands 88 are supported by the rods 98, 100 of the etching drum 70 as shown in FIG. 16.

Figure 18:
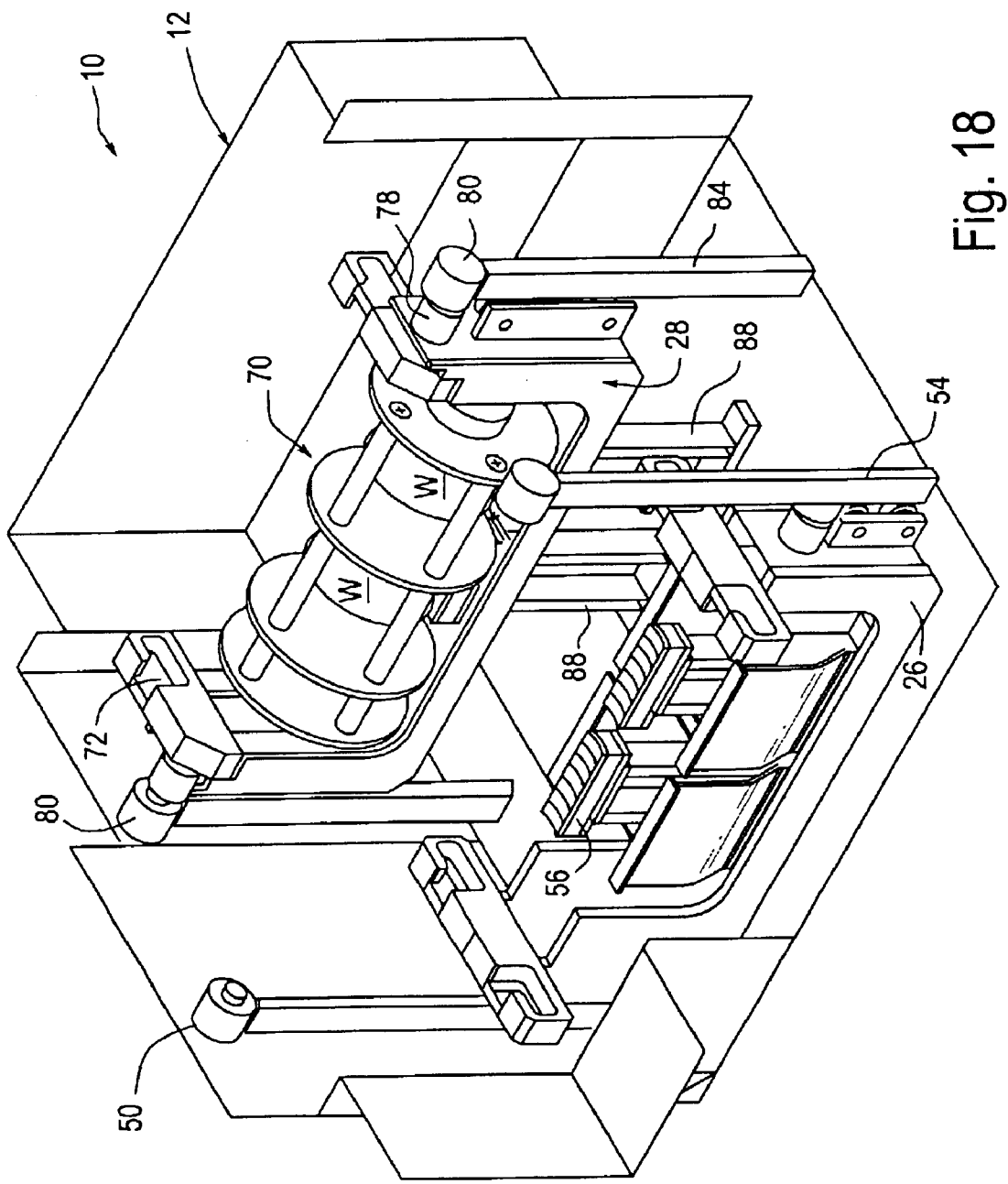
FIG. 18 illustrates the etching drum and drum lift in the raised position after the drum chucks are disengaged from the drum lift.

The wafer transfer unit 110 is then disengaged from the drum lift 28 by moving the rods 132 of the wafer chucks 128, 130 toward each other as represented by the arrows E, E in FIG. 17. FIG. 18 shows the drum lift 28 after the wafer transfer unit 110 is disengaged. The drum lift 28 is held in the fixed raised position by engagement of the drum lift stop elements 78, 80 as depicted by the arrow F in FIG. 17 and shown in FIG. 18.

Figure 19:
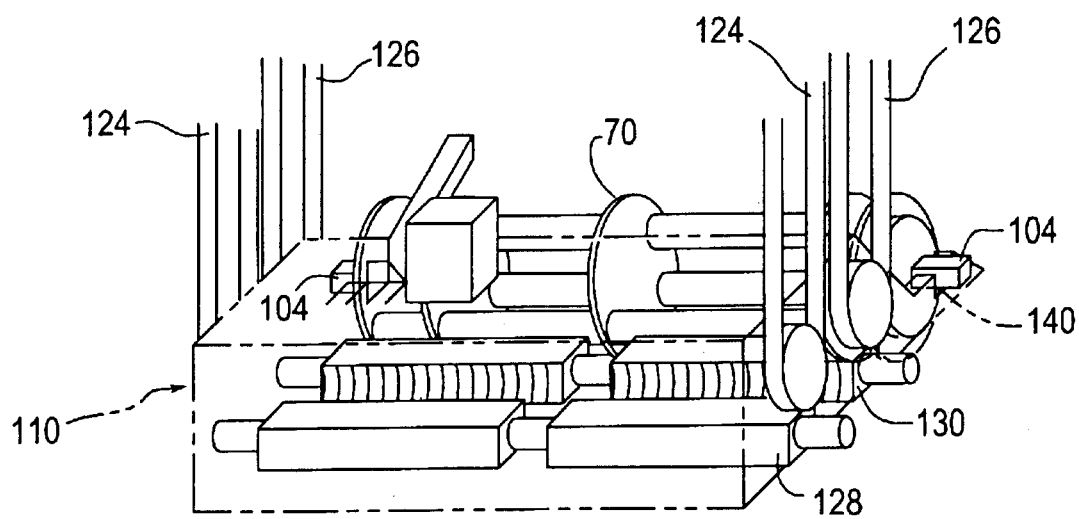
FIG. 19 illustrates the transfer unit after being disengaged from the drum lift and being moved to a side of the etching drum facing the first stands, showing a drum hand of the transfer unit engaged with a shaft of the etching drum and a wafer holding bar of the transfer unit engaged with a movable locking rod of the etching drum.
Figure 20:
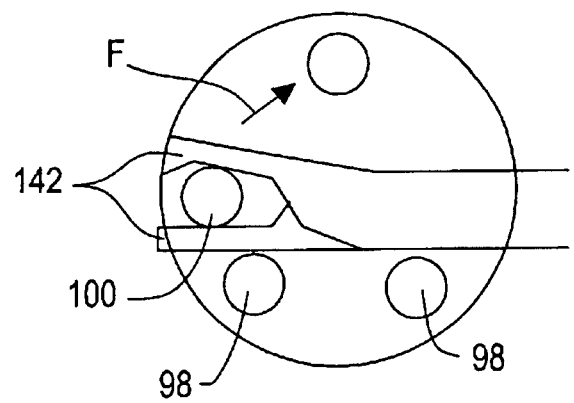
FIG. 20 is an enlarged partial view showing the wafer holding bar of the transfer unit engaged with the movable locking rod of the etching drum, with the locking rod in an unlocked position.

The etching drum 70 is then removed from the drum lift 28 by the wafer transfer unit 110. Specifically, the wafer transfer unit 110 is moved to the side of the etching drum 70 that faces the cassette lift 26 (front side). As shown in FIGS. 19 and 20, the wafer transfer unit 10 includes a pair of drum hands 140 which are each configured to support the shaft 104 of the etching drum 70. The wafer transfer unit 110 can also include a pair of wafer holding bars 142 that engage the locking rod 100 of the etching drum 70 and move the locking rod 100 from the unlocking to the locking position as depicted by arrow F. After the drum hands 140 are moved to support the etching drum 70, the wafer transfer unit 110 lifts the etching drum 70 upwardly and away from the drum lift 28.

The etching drum 70 can then be removed from the liquid in the tank 12 and moved by the wafer transfer unit 110 to another wafer fabrication location. Typically, the etching drum 70 is moved to the etching machine to etch the wafers. Following etching, the wafer transfer unit can move the etching drum 70 and wafers back to the apparatus 10. The wafers can then be transferred from the etching drum 70 to the wafer cassettes 34 by performing the above-described transfer steps in reverse order.

Accordingly, the apparatus 10 can be utilized to automatically transfer wafers to and from an etching machine without an operator having to manually handle the wafers during this transfer.

According to an aspect of this invention, the apparatus is preferably composed of materials that are non-contaminating to the liquid in the tank and to the wafers. For example, the components of the apparatus that are exposed to the liquid in the tank can be composed of non-metallic materials such as polyvinyl chloride (PVC), polytetrafluoroethylene (PTFE) and the like. Other components that are not exposed to the liquid can be composed of the same non-metallic materials, as well as metals such as stainless steels with a non-metallic material coating.

The etching drum 70 is composed of materials that are resistant to chemical attack in the etching machine. Suitable plastic materials are typically used to form the etching drum 70.

While this invention has been described in conjunction with the specific embodiments described above, it is evident that many alternatives, modifications and variations are apparent to those skilled in the art in view of this disclosure. Accordingly, the preferred embodiments of this invention as set forth above are intended to be illustrative and not limiting. Various changes can be made without departing from the spirit and scope of this invention as defined in the following claims.

What is claimed is:

1. A method of transferring wafers between wafer holders in a liquid contained in a transfer chamber, comprising:
   placing at least one wafer on a first wafer holder external to the liquid;
   automatically transferring the at least one wafer from the first wafer holder to a first stand disposed in the liquid;
   automatically removing the at least one wafer from the first stand;
   automatically transferring the at least one wafer to a second stand disposed in the liquid, the at least one wafer remaining immersed in the liquid during the transferring from the first stand to the second stand;
   automatically releasing the at least one wafer so that the at least one wafer is supported on the second stand; and
   automatically transferring the at least one wafer from the second stand to a second wafer holder disposed in the liquid, the at least one wafer remaining immersed in the liquid during the transferring from the second stand to the second wafer holder, the second wafer holder being removable from the liquid.

2. The method of claim 1, wherein the first wafer holder is a wafer cassette and the second wafer holder is an etching drum.

3. The method of claim 1, wherein the first stand and the second wafer holder each comprise a plurality of parallel grooves, each groove is sized to receive one of the at least one wafers, and a plurality of the wafers are transferred from the first wafer holder to the second wafer holder substantially without cross-indexing of the transferred wafers.

4. The method of claim 1, wherein a plurality of wafers are transferred from the first wafer holder to the second wafer holder (i) such that the plurality of wafers substantially do not contact each other during transfer, and (ii) substantially without cross-indexing of the transferred wafers.

5. The method of claim 1, wherein a plurality of wafers are transferred simultaneously from the first wafer holder to the first stand, simultaneously from the first stand to the second stand, and simultaneously from the second stand to the second wafer holder.

6. The method of claim 1, wherein the liquid is water.

7. The method of claim 1, wherein the first stand and the second stand are stationary in the transfer chamber.

8. A method of transferring wafers between a wafer holder and an etching drum in a liquid contained in a transfer chamber, comprising:
   placing at least one wafer on a wafer holder;
   lowering the wafer holder in the liquid contained in the transfer chamber until the at least one wafer is supported on a first stand;
   automatically removing the at least one wafer from the first stand;
   automatically transferring the at least one wafer to a second stand while the at least one wafer remains immersed in the liquid; and
   automatically moving the etching drum upwardly in the liquid to transfer the at least one wafer from the second stand to the etching drum, the etching drum being removable from the liquid.

9. The method of claim 8, wherein a plurality of said at least one wafer are transferred from the wafer holder to the etching drum substantially without cross-indexing of the wafers.

10. The method of claim 8, wherein the liquid is water.

11. The method of claim 8, wherein the first stand and the second stand are stationary in the transfer chamber.

12. A method of transferring wafers between wafer holders in a liquid contained in a transfer chamber, comprising:
    placing a plurality of wafers on a first wafer holder;
    lowering the first wafer holder in a liquid contained in a transfer chamber until the wafers are supported on a first stand;
    automatically grasping the wafers supported on the first stand;
    automatically moving the wafers to a second stand horizontally spaced from the first stand while the wafers remain immersed in the liquid;
    automatically releasing the wafers; and
    automatically raising a second wafer holder in the liquid to transfer the at least one wafer from the second stand to the second wafer holder, the second wafer holder being removable from the liquid.

13. The method of claim 12, wherein the first wafer holder is a wafer cassette and the second wafer holder is an etching drum.

14. The method of claim 12, wherein the first stand and the second wafer holder each comprise a plurality of parallel grooves, each groove is sized to receive one of the wafers, and the wafers are transferred from the first wafer holder to the second wafer holder substantially without cross-indexing of the transferred wafers.

15. The method of claim 12, wherein the wafers are transferred from the first wafer holder to the second wafer holder (i) such that the wafers substantially do not contact each other during transfer, and (ii) substantially without cross-indexing of the transferred wafers.

16. The method of claim 15, wherein the wafers are transferred simultaneously from the first wafer holder to the first stand, simultaneously from the first stand to the second stand, and simultaneously from the second stand to the second wafer holder.

17. The method of claim 12, wherein the liquid is water.

18. The method of claim 12, wherein the first stand and the second stand are each stationary in the transfer chamber.

19. The method of claim 12, wherein the first wafer holder is lowered in the liquid by a first lift that moves vertically in the liquid, and the second wafer holder is raised in the liquid by a second lift that moves vertically in the liquid.

* * * * *